United States Patent

Bissey

Patent Number: 6,054,754
Date of Patent: Apr. 25, 2000

[54] MULTI-CAPACITANCE LEAD FRAME DECOUPLING DEVICE

[75] Inventor: Lucien J. Bissey, Boise, Id.

[73] Assignee: Micron Technology, Inc., Boise, Id.

[21] Appl. No.: 08/864,727

[22] Filed: Jun. 6, 1997

[51] Int. Cl.[7] .............. H01G 1/14; H01L 23/02; H01L 23/12; H01L 25/00
[52] U.S. Cl. .............. 257/666; 257/532; 257/676; 257/916; 257/724; 257/659; 361/306.2
[58] Field of Search ................ 257/666, 676, 257/691, 692, 724, 659, 987, 916, 532; 361/306.2, 306

[56] References Cited

U.S. PATENT DOCUMENTS

| | | | |
|---|---|---|---|
| 4,410,905 | 10/1983 | Grabbe | 257/668 |
| 4,680,613 | 7/1987 | Daniels et al. | 252/659 |
| 4,891,687 | 1/1990 | Mallik et al. | 257/616 |
| 4,965,654 | 10/1990 | Karner et al. | 257/676 |
| 4,984,059 | 1/1991 | Kubota et al. | 361/306 |
| 4,989,117 | 1/1991 | Hernandez | 361/306 |
| 4,994,936 | 2/1991 | Hernandez | 257/916 |
| 5,032,895 | 7/1991 | Horiuchi et al. | 257/791 |
| 5,068,708 | 11/1991 | Newman | 257/668 |
| 5,095,402 | 3/1992 | Hernandez et al. | 361/306 |
| 5,103,283 | 4/1992 | Hite | 257/916 |
| 5,105,257 | 4/1992 | Michii | 257/692 |
| 5,140,496 | 8/1992 | Heinks et al. | 361/306 |
| 5,200,364 | 4/1993 | Loh | 257/724 |
| 5,212,402 | 5/1993 | Higgins, III | 257/672 |
| 5,235,209 | 8/1993 | Shimizu et al. | 257/692 |
| 5,237,202 | 8/1993 | Shimizu et al. | 257/672 |
| 5,272,590 | 12/1993 | Hernandez | 361/306.2 |
| 5,281,556 | 1/1994 | Shimizu et al. | 29/827 |
| 5,291,060 | 3/1994 | Shimizu et al. | 257/676 |
| 5,311,056 | 5/1994 | Wakabayashi et al. | 257/666 |
| 5,311,657 | 5/1994 | McShane | 257/676 |
| 5,365,106 | 11/1994 | Watanabe | 257/676 |
| 5,457,340 | 10/1995 | Templeton, Jr. et al. | 257/666 |
| 5,485,032 | 1/1996 | Marrs | 257/712 |
| 5,528,083 | 6/1996 | Malladi et al. | 257/786 |
| 5,552,631 | 9/1996 | McCormick | 257/666 |
| 5,572,065 | 11/1996 | Burns | 257/666 |
| 5,606,199 | 2/1997 | Yoshigai | 257/666 |
| 5,726,490 | 3/1998 | Muroi | 257/666 |
| 5,734,198 | 3/1998 | Steve | 257/666 |

FOREIGN PATENT DOCUMENTS

| | | | |
|---|---|---|---|
| 3626151 | 2/1988 | Germany . | |
| 63-93139 | 4/1988 | Japan . | |
| 3-165549 | 7/1991 | Japan | 257/676 |
| 3165549 | 7/1991 | Japan . | |
| 3276747 | 12/1991 | Japan . | |
| 4162657 | 6/1992 | Japan . | |
| 4188759 | 7/1992 | Japan . | |
| 6045504 | 2/1994 | Japan . | |

OTHER PUBLICATIONS

Hyperquad Series Type 5, Three Metal layer QFP (TM) QFP), 2 pages.

English translation of Japanese Patent No. 4188759.

*Primary Examiner*—Alexander Oscar Williams
*Attorney, Agent, or Firm*—Trask, Britt & Rossa

[57] ABSTRACT

A packaged integrated circuit device with a multi-level lead frame has a plurality of integral capacitors formed by placing a thin dielectric layer between a lower lead frame and an upper lead frame, one of the lead frames being subdivided into a plurality of portions, each subdivided portion with an accessible tab for wire attachment. The planar capacitors are bonded to the bottom surface of the chip and act as a die support paddle. Each capacitor may be configured to provide the desired voltage decoupling and noise suppression for a particular portion of the integrated circuit to which it is connected. Capacitors useful for other purposes may be likewise provided in the package.

65 Claims, 2 Drawing Sheets

MULTI-CAPACITANCE LEAD FRAME DECOUPLING DEVICE

BACKGROUND OF THE INVENTION

1. Field of the Invention

This invention relates generally to semiconductor devices having molded housings. More particularly, the invention pertains to an apparatus and method for suppressing power supply voltage modulation and noise in packaged integrated circuits (ICs) such as leaded or unleaded chip carriers, dual-in-line packages (DIP), pin-grid array packages, leads-over-chip (LOC) packages, quad flat packages (QFP) and other packages.

2. State of the Art

A modern packaged integrated circuit (IC) comprises one or more encapsulated semiconductor die(s) or chip(s) within a protective "package" of plastic, ceramic, or other material. A plurality of external connections, typically designed for soldering, are connected to bond pads on the encapsulated die(s), enabling the die(s) to be electrically connected to an external electrical apparatus including a power supply.

Despite the relatively short distance between external terminals of a semiconductor device and the integrated circuit chip or die within the package, inductance is present from outer leads, inner leads, wire bonds and other conductors connected to the power supply. The high switching speeds of digital circuits requires relatively high levels of instantaneous current to achieve the desired switching operations. In such high frequency switching operations of integrated circuits (IC), the inductance results in the coupling of transient energy into the power supply circuit to modulate the power supply voltage. The modulation of the power supply voltage will be equal to the product of the inductance and the time rate of change of the current through the conductor. The power supply modulation, generally referred to as power supply noise, may cause malfunctions in the IC circuit, degrading the overall performance of the resin-encapsulated integrated circuit and/or rendering the packaged IC unusable.

To reduce this problem, it has been proposed in Japanese Patent No. A6045504 of Miyazaki Oki Electric Co. Ltd. to provide a plurality of metal plates attached to the upper and lower surfaces of a leadframe by an insulative adhesive. A reduction in "lead crosstalk noise" is claimed, although none of the plates is shown as being electrically connected to the circuit to provide capacitance.

It has been found, however, that a more effective device to reduce lead inductance is to provide leads of greater size and/or of shorter length.

Thus, in U.S. Pat. No. 5,032,895 of Horiuchi et al., a quad flat package (QFP) structure is shown in which a metal plate is adhered to the lead frame beneath the chip. The metal plate is connected to an external power supply and serves as a power lead for the chip. The size of the metal plate reduces the inductance of the device. Use of a decoupling capacitor is not disclosed.

U.S. Pat. No. 5,105,257 of Michii discloses the use of large coplanar trapezoidal power leads and ground lead underlying the chip of a semiconductor device, for reducing lead inductance and increasing heat transfer. No capacitor is shown.

A much more effective solution for decoupling transient coupled energy in the integrated circuit is to connect a decoupling capacitor across the affected portion(s) of the circuit. The capacitor counters the transient voltage changes and suppresses the resulting noise.

An early suppressor of the undesirable electrical coupling comprised a decoupling capacitor mounted on a circuit board e.g. separate from the packaged IC, but connected across the power supply, i.e. across the power plane and ground plane leads. The length of the conductive path between the external decoupling capacitor and the chip circuit was, of necessity, lengthy. In many instances, the path length resulted in high inductance and caused high voltage drops due to such inductance.

Subsequently, decoupling capacitors have been mounted on the IC package itself in order to reduce the conductive lead length between the capacitor and the chip. For example, a monolithic multilayer decoupling ceramic chip capacitor may be attached to the underside of an IC package.

Recent developments have resulted in the need for an improved decoupling capacitor. First, the numbers of inner leads in a package have escalated, requiring that lead width be reduced and lead length increased. As a result of longer, narrower leads, lead inductance and electrical coupling between adjacent inner leads become operational problems under more benign conditions.

In addition, the power dissipation required of many newer chip packages has been significantly increased, such that coupling produces more severe voltage aberrations and noise in the power supply circuit.

Also, newer electronic equipment operate at higher clock rate frequencies which of course increases the incidence of coupling and the resulting noise.

Furthermore, certain particular applications for packaged integrated circuits may be much more demanding. For example, in some applications, ICs must be capable of withstanding high ionizing radiation without failure.

Various decoupling schemes have been developed to cope with these recent developments. In U.S. Pat. No. 4,680,613 of Daniels et al., for example, a metal ground plane is attached to the leadframe with encapsulant during the encapsulation process and becomes a ground lead with low inductive impedance. In addition, however, a multilayer capacitor (MLC) chip is placed within the polymer IC package remote from the chip.

Ideally, the decoupling capacitor should be as close to the chip or die as possible to reduce the lead induction and maximize its suppressive effect. Thus, the capacitor will be encapsulated within the IC package and typically will closely parallel the die surface. Various attempts to produce such a package are shown in the patent literature as follows:

U.S. Pat. No. 4,410,905 of Grabbe shows a decoupling structure for a semiconductor device, wherein a chip is mounted atop a beryllium oxide sliver. The upper surface of a chip carrier has an interdigitated lead pattern, and is bonded by a bonding agent to the underside of the beryllium oxide sliver.

In U.S. Pat. No. 4,891,687 of Mallik et al., a chip carrier and a lead frame have interposed therebetween a pair of parallel metal plates comprising an upper ground plane and a lower power plane. The metal plates are joined by Kapton tape, and a chip is mounted within a space in the plates to the power plane. Decoupling capacitors may be installed between the two metal plates.

In U.S. Pat. No. 5,140,496 of Heinks et al. one or more decoupling capacitors are placed directly atop or beneath the chip and connected by multiple wire bonds to power supply connections on the chip surface.

U.S. Pat. No. 4,994,936 of Hernandez shows a packaged integrated circuit in which a decoupling capacitor is attached to the upper die surface or to the underside of the lead frame.

Japanese Patent Application No. 64-305219 of Seiko Epson Corporation describes a semiconductor device in which an electrode is bonded to a portion of an underlying lead frame by a dielectric material. The die is then bonded to the electrode with an insulative film. The lead frame portion and electrode are then connected to the die to form a capacitor.

Japanese Patent No. A 3276747 of NEC Corporation describes a 2-layer chip support member including lead-frame planes having an interposed insulation layer. The two planes are electrically connected to a Vcc power source and a ground power source, respectively, to provide noise-preventing capacitance.

In Japanese Patent No. A 4162657 of Hitachi Ltd., a semiconductor device is shown which has a two-part lead frame with parallel tab parts joined by a dielectric material such as ceramic. A die is mounted on the upper tab part and the two tab parts are electrically connected across the power supply to provide a capacitor.

Japanese Patent No. A 4188759 of Mitsubishi Electric Corporation discloses a semiconductor device having a planar capacitor formed of two lead frames joined by an insulator, the capacitor underlying the chip.

Although the state of the art in package configuration is continually improving, ever-increasing demands for further miniaturization, circuit complexity, higher clock rates, higher production speed, reduced cost, improved product uniformity and reliability require further improvements in packaged semiconductor devices by which electrical coupling and inductance noise are minimized or eliminated.

BRIEF SUMMARY OF THE INVENTION

The invention comprises an apparatus and method for suppressing power supply voltage modulation and noise in packaged integrated circuits (ICs) such as leaded or unleaded chip carriers, dual-in-line packages (DIP), pin-grid array packages, leads-over-chip (LOC) packages, quad flat packages (QFP) and other packages.

In the present invention, an integrated circuit device includes a plurality of integral flat capacitors closely aligned with and parallel to a major surface of the die (chip). One or more of the capacitors may be connected across power supply leads and/or other lead pairs to reduce coupling and suppress noise produced thereby. The present invention further includes a method for forming the integrated circuit device including the integrated circuit and decoupling capacitor(s).

The integrated circuit device includes a multiple layer lead frame. One layer of the lead frame comprises a first conductive layer of the decoupling capacitor(s). A second layer of the lead frame comprises a second, opposite conductive layer of the capacitor(s), and the two layers are joined by an interposed dielectric material to create the capacitor(s). Together, the layers may be looked upon as a "paddle" or "die support platform" to which a die is down-bonded.

One or both of the lead frame layers are subdivided to form multiple capacitors having different capacitance and/or adapted to optimally operate at different switching frequencies. Each capacitor may be connected across a different portion of the integrated circuit, enabling custom design of capacitors appropriate for each circuit portion. In one embodiment, one lead frame layer may be a single "plate" common to a plurality (or all) of the capacitors and connected to e.g. the power supply ground plane Vss, or to another common voltage plane.

The decoupling capacitor(s) are closely positioned to the die, i.e. chip, enabling the use of short wire leads. Thus, conductor inductances between the capacitor(s) and the bond pads on the die are much reduced.

The invention may be applied to a leads-over-chip device by including a third (uppermost) lead frame member which includes lead fingers which partially overlie the active surface of the chip, and outer leads connected to the lead fingers for connecting the device to a circuit board or other apparatus.

The device including one or more integral decoupling capacitors is encapsulated by a plastic material such as epoxy, using transfer molding techniques or other encapsulation methods known in the art.

The plurality of special capacitors produces more effective decoupling of coupled electrical aberrations in various circuit portions. In addition, the overall inductance in the integrated circuit conductors is reduced. Furthermore, it is evident that one or more of the capacitors may be configured for use as circuit elements other than a decoupler/noise suppressor. Thus one or more of the capacitors may be connected to the IC circuitry to provide a capacitor connected thereto rather than having to build a capacitor in the integrated circuit on the chip.

BRIEF DESCRIPTION OF THE DRAWINGS

The invention is illustrated in the following figures, wherein the elements are not necessarily shown to scale.

The figures illustrate the invention as applied to a die having an array of wirebond pads along opposing peripheral portions of the active surface. However, other die/lead configurations may be useful, such as the quad flat package (QFP), for example. Thus, the figures should be viewed as exemplary of the invention and not limiting the invention to the exact embodiment shown.

DESCRIPTION OF THE ILLUSTRATED EMBODIMENTS

An improved integrated circuit device and method of production thereof are provided by the invention. The integrated circuit package includes a plurality of integral capacitors of which one or more may comprise decoupling/noise suppression capacitors.

Figure 1:
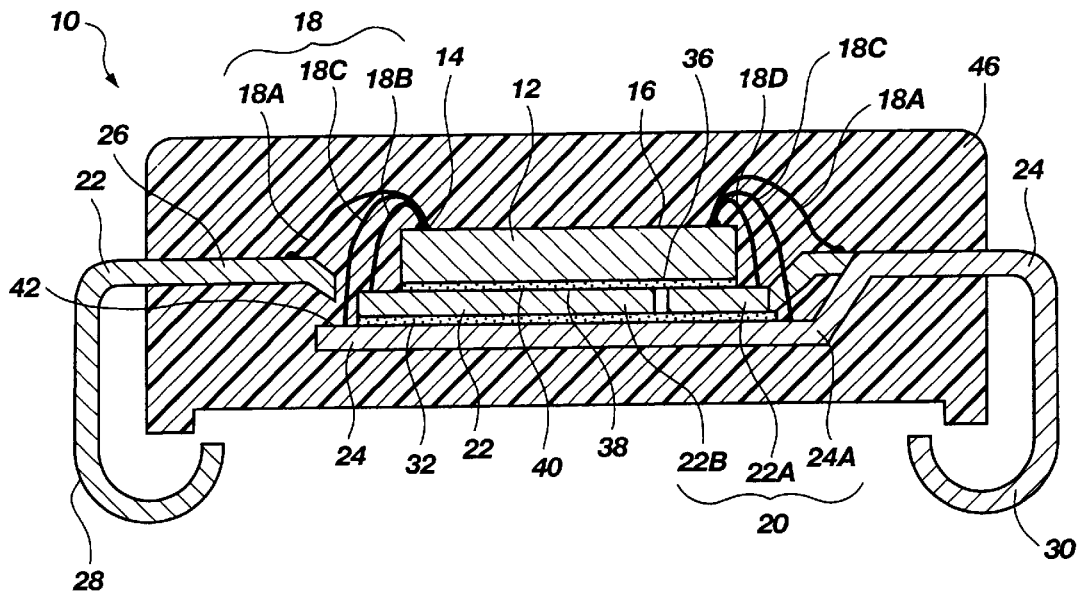
FIG. 1 is a cross-sectional end view through a packaged integrated circuit of the invention.
Figure 3:
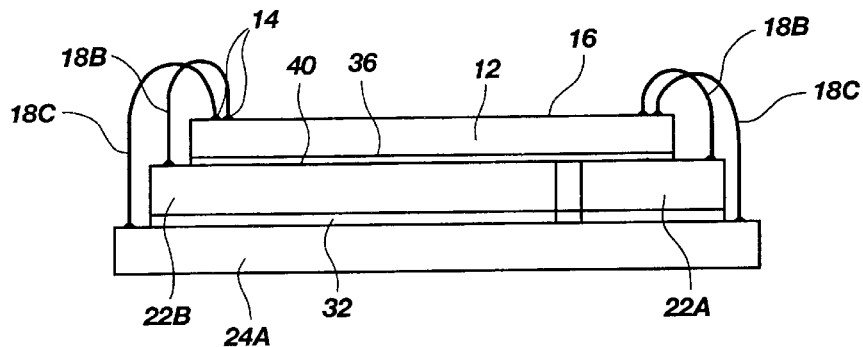
FIG. 3 is a cross-sectional end view of a packaged integrated circuit of the invention.
Figure 2:
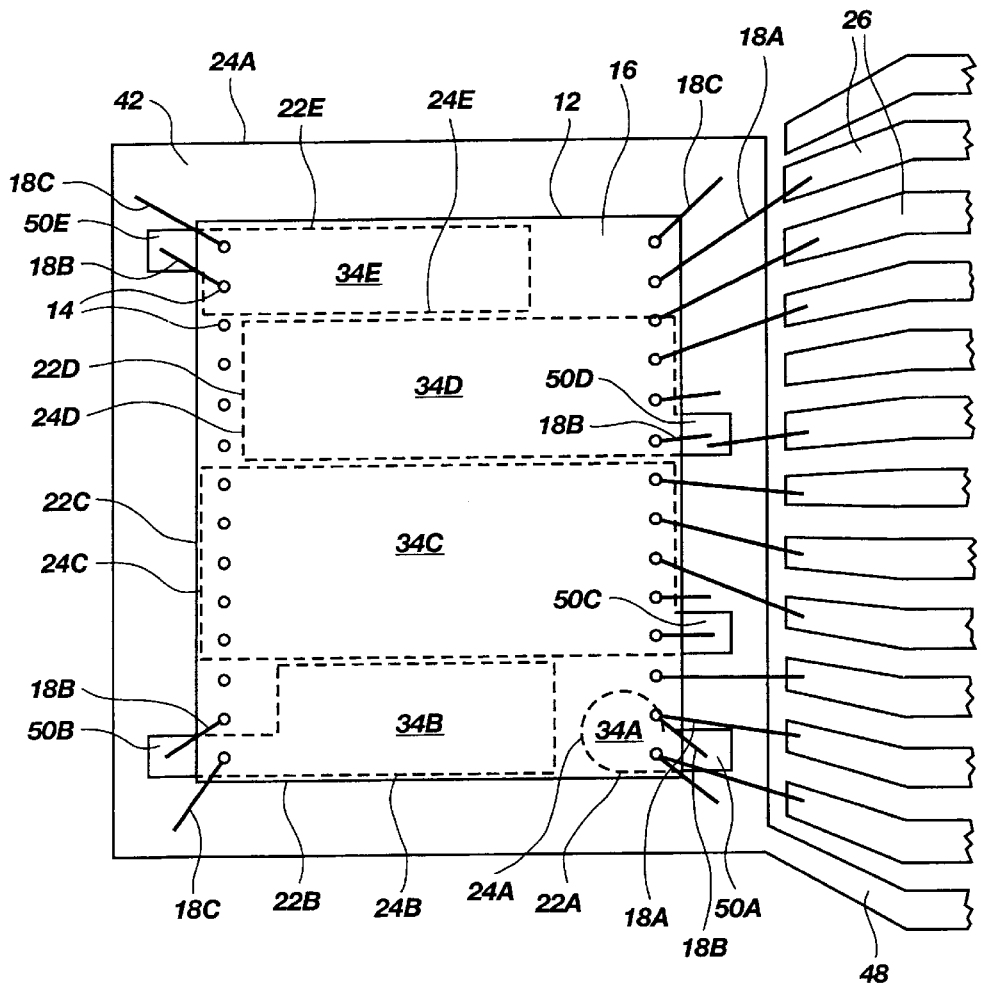
FIG. 2 is a partial top view of the integrated circuit of FIG. 1 showing the internal construction.

With reference to the drawings of FIGS. 1–4, and particularly with reference to FIGS. 1 to 3, a packaged integrated circuit device 10 is illustrated in cross-section. The present invention is well suited for use with any type of molded IC package including but not limited to e.g. plastic leaded or leadless chip carriers, dual-in-line packages and quad flat packs. All components of the integrated circuit device 10 are encapsulated in a protective material 46, typically plastic, with the exception of the external leads, e.g. J-leads 28 and 30.

The integrated circuit device 10 includes a semiconductor chip 12, typically of silicon or gallium arsenide. The chip 12 is shown with wire bond pads 14 on its upper, active surface 16, for attachment of conductive wires 18 thereto. A multi-level lead frame 20 comprises an upper lead frame 22 and a lower lead frame 24. Upper lead frame 22 includes planar upper lead frame portions 22A and 22B, as well as lead fingers 26 and outer lead 28, shown as a J-lead. Lower lead frame 24 includes a planar lower lead frame portion 24A as well as an outer lead 30, also shown as a J-lead.

As indicated, upper lead frame portions 22A and 22B are joined to lower lead frame portion 24A by a thin layer 32 of a selected dielectric material such that the upper lead frame portion 22A and lower lead frame portion 24B with interposed layer 32 of dielectric material comprise a first capacitor 34A. Likewise, upper lead frame portion 22B together with lower lead frame portion 24A and interposed dielectric material comprise a second capacitor 34B.

The die 12 has its lower surface 36 attached to the upper surface 38 of the upper lead frame portions 22A, 22B by an insulative adhesive 40 such as an epoxy, polyimide, or other adhesive. Thus, the combinations of upper and lower lead frame portions with interposed dielectric layer 32 not only comprise a plurality of capacitors 34, but also serve as a die support platform, i.e. paddle.

The dielectric may be any conventional dielectric material providing the desired capacitative properties and having the capability of being firmly adhered to the lead frame members. Preferably, the dielectric is a polymeric adhesive material although it may be otherwise, e.g. ceramic joined to the lead frame portions by a conductive adhesive. The dielectric properties, i.e. dielectric constant $K_e$ and dielectric strength, volts/mil, of polymeric materials vary widely, and may be tailored to suit particular requirements.

Various methods may be used to form the dielectric material layer between the upper and lower lead frame portions. Where the dielectric material comprises a liquid resin adhesive which is thermally or radiation curable, or simply dryable at ambient conditions, the process includes application of a thin layer on one lead frame portion followed by joining to the other lead frame portion and curing.

For some dielectrics which are obtained in film form, the film may be joined to each lead frame member by a thin layer of conductive or non-conductive adhesive.

Examples of polymeric dielectric film materials useful in forming the interposed layer 32 of the capacitors 34 include polytetrafluoroethylene, Kapton™ film, and Mylar plastic film, both trademarked products of DuPont. Such materials have a very high insulation resistance, typically greater than 1000 MΩ, low losses and a long service life.

Each of the upper lead frame portions 22A and 22B may be insulatively attached to the lower lead frame portion 24A by a different dielectric material having different electrical properties, so that the resulting capacitors 34 have different capacitances and/or may operate as decoupling capacitors in a differing range of switching frequencies. In addition, capacitors useful for purposes other than noise suppression and decoupling may be formed using the upper and lower lead frame portions and incorporated in the circuit within the package 10. Placement of multiple integral capacitors within the IC package in accordance with this invention not only results in a small package but enhances both the operating characteristics and the range of usefulness of the IC.

Thus a first capacitor may be a high end frequency noise suppression capacitor and a second capacitor may be a low end frequency noise suppression capacitor. By designing each capacitor 34 to have a particular capacitance, both high frequency noise suppression and decoupling will occur simultaneously in the integrated circuit 10.

The electrical characteristics of each capacitor 34 are dependent upon a number of variables, including surface area, shape, type and thickness of dielectric material, etc. Thus, each capacitor 34 may be specifically tailored for its designated use.

A capacitor 34 useful for decoupling and noise suppression may be connected across the Vss and Vdd leads for example, to provide decoupling and noise suppression in that conductor pair. As a result, the power supply voltage will be maintained within the limits required by the integrated circuit for proper operation.

As illustrated in FIG. 1, thin conductive wires 18 are bonded at one end to appropriate wire bond pads 14 on the semiconductor chip 12 and at the opposite end to lead fingers 26 (wires 18A), to upper lead frame portions 22A and 22B (wires 18B and 18D, respectively), and to lower lead frame portion 24A (wires 18C).

In the embodiment of the invention illustrated in FIG. 1, lower lead frame portion 24A is formed with an external lead 30 such as a J-lead whereby the lower lead frame portion may be connected to a Vss or Vdd side of the power supply to the chip 12. The lower lead frame portion 24A has an exposed upper surface 42 at its periphery to which conductive wires 18C may be connected, joining wire bond pads 14 on the chip surface 16 with the lower lead frame portion 24A. Thus, the lower lead frame portion 24A may comprise one side of a plurality of individually tailored capacitors 34 and also serve as a bus for e.g. Vss or Vdd.

The lead frames 22, 24 which comprise the multi-level lead frame 20 are made by stamping or etching a pattern of inner lead fingers, outer leads, die mount, etc. in each of several thin plates formed of a conductive metal such as a copper alloy. The leads, die mount and other portions of the multi-level lead frame 20 are interconnected by crossbars 44 (see FIG. 2) for support during the assembly process. As known in the art, the crossbars 44 are later excised from the pattern to singulate the leads and other components of the lead frame 20, electrically isolating them from each other.

FIGS. 2 and 3 illustrate, in part, the major components of the integrated circuit prior to encapsulation. For the sake of clarity, lead fingers 26 are shown on one side only of the chip 12 in FIG. 2, and not at all in FIG. 3. Generally rectangular lower lead frame portion 24A is shown with exposed upper peripheral surface 42. Lower lead frame portion 24A is shown with a connected lead 48 which terminates in a J-lead 30 (see FIG. 1). The J-lead 30 may be connected to one of the power supply terminals, providing the lower lead frame portion 24A with Vss or Vdd. The substantial expanse of exposed peripheral area 42 enables the lower lead frame portion 24A to be readily accessed by wires 18C from wire bond pads 14 on the active surface 42 of the chip 12 to provide Vss or Vdd to the chip.

FIG. 2 illustrates an example of the invention, showing by example five upper lead frame portions 22A, 22B, 22C, 22D and 22E, each occupying a portion of the underside of the chip 12 and outlined by intermittent lines. Each of the upper lead frame portions, together with the underlying lower lead frame portion 24A and intervening dielectric layer 32, comprises a capacitor 34. Thus, upper lead frame portions 22A, 22B, 22C, 22D and 22E correspond to capacitors 34A, 34B, 34C, 34D and 34E. Each of the upper lead frame portions is shown with an integral tab 50A, 50B, 50C, 50D, and 50E, respectively, to which conductive wires 18B are attached for connecting the upper lead frame portions to wire bond pads 14 on the active surface 16. Wires 18A connect other bond pads 14 to lead fingers 26 which terminate in external leads such as J-leads. The layer 32 of dielectric material and the adhesive 40 which bonds the chip 12 to the upper lead frame portions are not visible in FIG. 2.

Preferably, the area of the lower surface of the chip 12 is at least one-half occupied by the upper lead frame portions 50 to enhance the attachment. However, at least some portion of each upper lead portion 50 extends outwardly from the chip outline to enable connection by wire bonds thereto.

Because of size limitations, the number of individual capacitors formed by subdividing the upper lead frame portion 22 will be generally limited, typically to less than about 6–10. Thus, the tabs 50 will generally overlie only a small portion of the exposed upper surface 42 of the lower lead frame portion 24A. Preferably, the lower lead frame portion 24A may be minimized in size, to extend out from the chip 12 no more than is necessary to join the conductive wires 18C thereto. Thus, the overall package size will be less than packages of the prior art which use a single tubular decoupling capacitor.

Figure 4:
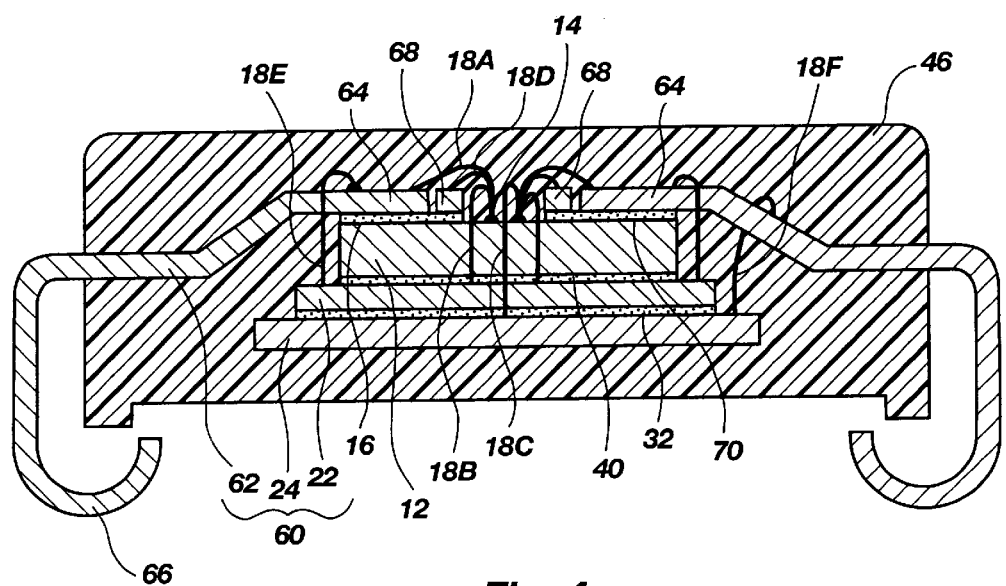
FIG. 4 is a cross-sectional end view of another embodiment of the packaged integrated circuit of the invention.

While FIGS. 1–3 illustrate the lead frame 20 as comprised of two lead frame portions 22 and 24, a third lead frame portion having a major portion or all of the lead fingers and outer leads may be combined therewith in the uppermost position, particularly where a leads-over-chip (LOC) configuration is used. As illustrated in FIG. 4, a 3-level lead frame 60 includes upper lead frame 22, lower lead frame 24 and a third uppermost lead frame 62. The lead frame 62 is configured to have lead fingers 64 and two transverse buses 68 overlying the upper surface 16 of a LOC chip 12 and extending outwardly to external terminals, e.g. J-leads 66. The capacitors are formed of the upper lead frame 22, lower lead frame 24 and intervening dielectric layer 32.

The upper and/or lower lead frame 22 and 24 may have portions which extend from the formed capacitor(s) to particular leads of the uppermost lead frame 62, as previously illustrated in FIG. 1.

FIG. 4 illustrates wires 18A which connect the wire bond pads 14 with the lead fingers 64, while wires 18B connect pads 14 with the various upper lead frame portions 22, i.e. 22A, 22B, etc. In addition, wires 18C connect pads 14 with the lower lead frame 24. Wires 18D connect pads 14 with the buses 68.

Other alternative wire connections are shown, although they are not the preferred embodiment. Thus, wires 18E and 18F connect lead fingers 64 with the upper lead frame 22 and the lower lead frame 24, respectively.

It is advantageous in this embodiment to provide Vss and Vdd buses 68 adjacent the lead fingers 64 in the third lead frame 62, because of the distance between the centrally located wire bond pads 14 and the lower lead frame portion 24, and the lack of space resulting from the lead fingers 64. The pattern of lead fingers in the third lead frame may be configured to permit the necessary space for connecting wires 18E and 18F from lead fingers 64 to the upper and lower lead frames 22 and 24, respectively. As practiced in the art, the lead fingers 64 are separated from the active surface 16 by an insulative layer 70 such as Kapton™ tape, a registered trademark of DuPont.

In FIGS. 1–4, the capacitors 34A, 34B, ... are illustrated with the upper lead frame 22 subdivided to provide multiple capacitors. In an alternative construction, the lower lead frame 24 is subdivided into tabbed portions 24A, 24B, 24C, etc., each comprising one side of a capacitor 34. One advantage of this configuration is that the possibility of entrapping gases during encapsulation in the relatively narrow spaces formed by subdividing the lead frame is much reduced, the subdivided lead frame being open on one side.

The IC device may also be encapsulated in an inverse position. Thus, the integrated circuits of FIGS. 1 and 4 may be inverted within the encapsulant 46.

In the manufacture of semiconductor devices 10 of the invention, the steps involved include:

(a) forming a multi-level conductive lead frame with a planar lower lead frame portion and a planar upper lead frame portion partially coextensive therewith, said upper lead frame portion configured to support a semiconductor chip and subdivided into a plurality of coplanar units with outwardly extending conductive tabs, said lead frame including centrally directed inner leads formed in one of the lead frame portions;

(b) joining the upper surface of the lower lead frame portion to the lower surface of the subdivided upper lead frame portion with an intervening thin layer of dielectric material, whereby each of the plurality of units having upper and lower lead frame portions with intervening dielectric material comprises a capacitor;

(c) bonding the non-active surface of a semiconductor chip to the upper surface of the subdivided upper lead frame portion with an insulative adhesive;

(d) lancing the lead frame portions to singulate inner leads;

(e) bonding conductive wires between wire bond pads on the active surface of the chip and the inner leads, the conductive tabs of the subdivided upper lead frame portion, and the lower lead frame portion;

(f) encapsulating the chip, inner leads, plurality of capacitors, and conductive wires in a plastic package by e.g. transfer molding; and (g) lance-singulating and forming outer leads for connecting the packaged integrated circuit to an electronic apparatus such as e.g. a circuit board.

Where the chip or die is of the LOC design, i.e. the wire bond pads are generally located along a central axis of the active surface, the multi-level lead frame will include a third lead frame portion having inner leads with lead fingers, and outer leads.

As previously described, the lower lead frame portion may be subdivided, either in addition to, or in place of, subdivision of the upper lead frame portion. Thus, in one embodiment, each of the formed capacitors requires two electrical connections. Where one of the lead frame portions is common to all of the capacitors, the number of electrical connections to the capacitors is reduced, simplifying the construction.

The IC package having integral capacitors of the invention, as illustrated and described herein is exemplary only, and may include other elements such as additional dies and leadframes, heatsinks, other dielectric layers, etc., as known in the art.

It is apparent to those skilled in the art that various changes and modifications may be made in the integrated circuit manufacturing methods and products as disclosed herein without departing from the spirit and scope of the invention as defined in the following claims.

What is claimed is:

1. An integrated circuit device assembly comprising:
   an integrated circuit (IC) chip having at least one integrated circuit therein, said IC chip having an active surface thereon having, in turn, at least one contact pad arranged thereon and a second surface for mounting said chip;

an upper conductive planar leadframe member having an upper surface to which said second surface is mounted over a major area portion thereof with an intervening electrically insulative adhesive, and a lower surface, said upper leadframe member subdivided into multiple portions, at least one portion of said multiple portions having an exposed tab connected to said at least one integrated circuit of said IC chip;

a lower conductive planar leadframe member having an upper surface to which the lower surface of said upper leadframe member is mounted over a portion thereof with a thin intervening layer of dielectric material whereby capacitance results, said lower leadframe member configured to cooperate with said upper conductive leadframe member;

at least one lead of a plurality of leads connecting at least one contact pad to at least one lead finger; and at least one lead of a plurality of leads connected to at least one tab of said upper leadframe member.

2. The integrated circuit device assembly of claim 1, further comprising:

material encapsulating said IC chip.

3. The integrated circuit device assembly of claim 1, wherein the lower leadframe member is unitary and is connected to one of a power supply Vss and Vdd to provide a common voltage to said lower leadframe member.

4. The integrated circuit device assembly of claim 1, wherein said upper leadframe member is subdivided into a plurality of coplanar portions representing individual capacitors having said lower leadframe member as a common side.

5. The integrated circuit device assembly of claim 1, wherein said subdivided multiple portions of said upper leadframe member include one portion configured for high end frequency noise suppression and another portion configured for low end frequency noise suppression.

6. The integrated circuit device assembly of claim 1, wherein said subdivided multiple portions of said upper leadframe member includes a portion configured for decoupling of high transient voltage, said portion together with the non-subdivided leadframe member electrically connected across the Vdd and Vss of said integrated circuit.

7. The integrated circuit device assembly of claim 1, wherein the upper and lower leadframe members together comprise a portion of a multi-level leadframe.

8. The integrated circuit device assembly of claim 1, wherein said contact pad includes a contact pad arrayed along a periphery of at least one side of said first surface of said chip.

9. The integrated circuit device assembly of claim 1, further comprising:

a third, uppermost leadframe member including inner lead fingers and external leads.

10. The integrated circuit device assembly of claim 1, wherein said chip comprises:

a LOC chip with at least one contact pad arrayed along a substantially central axis of said chip.

11. The integrated circuit device assembly of claim 1, wherein said at least one other lead of said plurality of leads connected to said at least one tab of said upper leadframe member comprises a conductive wire.

12. The integrated circuit device assembly of claim 1, wherein said dielectric material is a polymeric adhesive.

13. The integrated circuit device assembly of claim 1, wherein said dielectric material is a polymeric film joined to the upper and lower leadframe members with an adhesive.

14. An integrated circuit device assembly comprising:

an integrated circuit (IC) chip having at least one integrated circuit therein, said IC chip having an active surface thereon having, in turn, at least one contact pad arranged thereon and a second surface for mounting said chip;

an upper conductive planar leadframe member having an upper surface to which said second surface is mounted over a major area portion thereof with an intervening electrically insulative adhesive, and a lower surface;

a lower conductive planar leadframe member having an upper surface to which the lower surface of said upper leadframe member is mounted over a portion thereof with a thin intervening layer of dielectric material whereby capacitance results, said lower leadframe member subdivided into multiple portions, at least one portion of said multiple portions having an exposed tab connected to said at least one integrated circuit of said IC chip, said lower leadframe member configured to cooperate with said upper conductive leadframe member;

at least one lead of a plurality of leads connecting at least one contact pad to at least one lead finger; and at least one lead of a plurality of leads connected to at least one tab of said lower leadframe member.

15. The integrated circuit device assembly of claim 14, further comprising:

material encapsulating said IC chip.

16. The integrated circuit device assembly of claim 14, wherein the upper leadframe member is unitary and is connected to one of a power supply Vss and Vdd to provide a common voltage to said upper leadframe member.

17. The integrated circuit device assembly of claim 14, wherein said lower leadframe member is subdivided into a plurality of coplanar portions representing individual capacitors having said upper leadframe member as a common side.

18. The integrated circuit device assembly of claim 14, wherein said subdivided multiple portions of said lower leadframe member include one portion configured for high end frequency noise suppression and another portion configured for low end frequency noise suppression.

19. The integrated circuit device assembly of claim 14, wherein said subdivided multiple portions of said lower leadframe member includes a portion configured for decoupling of high transient voltage, said portion together with the non-subdivided leadframe member electrically connected across the Vdd and Vss of said integrated circuit.

20. The integrated circuit device assembly of claim 14, wherein the upper and lower leadframe members together comprise a portion of a multi-level leadframe.

21. The integrated circuit device assembly of claim 14, wherein said contact pad includes a contact pad arrayed along a periphery of at least one side of said first surface of said chip.

22. The integrated circuit device assembly of claim 14, further comprising:

a third, uppermost leadframe member including inner lead fingers and external leads.

23. The integrated circuit device assembly of claim 14, wherein said chip comprises:

a LOC chip with at least one contact pad arrayed along a substantially central axis of said chip.

24. The integrated circuit device assembly of claim 14, wherein said at least one other lead of said plurality of leads connected to said at least one tab of said lower leadframe member comprises a conductive wire.

25. The integrated circuit device assembly of claim 14, wherein said dielectric material is a polymeric adhesive.

26. The integrated circuit device assembly of claim 14, wherein said dielectric material is a polymeric film joined to the upper and lower leadframe members with an adhesive.

27. An integrated circuit device assembly comprising:
   a housing;
   an integrated circuit (IC) chip located in said housing, said IC chip having at least one integrated circuit therein, said IC chip having a first surface with at least one contact pad arranged thereon and a second surface for mounting said chip, said chip subject to transient electrical coupling and noise generation;
   an upper conductive planar leadframe member having an upper surface to which said second surface is mounted over a major area portion thereof with an intervening electrically insulative adhesive, and a lower surface, said upper leadframe member subdivided into multiple portions, at least one portion of said multiple portions having an exposed tab connected to said at least one integrated circuit;
   a lower conductive planar leadframe member having an upper surface to which the lower surface of said upper leadframe member is mounted over a portion thereof with a thin intervening layer of dielectric material whereby capacitance results, said lower leadframe member configured to cooperate with said upper conductive leadframe member;
   at least one lead of a plurality of leads connecting at least one contact pad to at least one lead finger; and
   at least one lead of a plurality of leads connected to at least one tab of said upper leadframe member and across portions of said integrated circuit subject to transient coupling and noise generation.

28. The integrated circuit device assembly of claim 25, wherein the lower leadframe member is unitary and is connected to one of a power supply Vss and Vdd to provide a common voltage to said lower leadframe member.

29. The integrated circuit device assembly of claim 27, wherein said upper leadframe member is subdivided into a plurality of coplanar portions representing individual capacitors having said lower leadframe member as a common side.

30. The integrated circuit device assembly of claim 27, wherein said subdivided multiple portions of said upper leadframe member include one portion configured for high end frequency noise suppression and another portion configured for low end frequency noise suppression.

31. The integrated circuit device assembly of claim 27, wherein said subdivided multiple portions of said upper leadframe member includes a portion configured for decoupling of high transient voltage, said portion together with the non-subdivided leadframe member electrically connected across the Vdd and Vss of said integrated circuit.

32. The integrated circuit device assembly of claim 27, wherein the upper and lower leadframe members together comprise a portion of a multi-level leadframe.

33. The integrated circuit device assembly of claim 27, wherein said at least one contact pad includes:
   a pad arrayed along a periphery of at least one side of said first surface of said chip.

34. The integrated circuit device assembly of claim 27, further comprising:
   a third, uppermost leadframe member including inner lead fingers and external leads.

35. The integrated circuit device assembly of claim 27, wherein said chip comprises:
   a LOC chip with contact pads arrayed along a generally central axis.

36. The integrated circuit device assembly of claim 27, wherein said at least one other lead of said plurality of leads connected to said at least one tab of said upper leadframe member comprises a conductive wire.

37. The integrated circuit device assembly of claim 27, wherein said dielectric material is a polymeric adhesive.

38. The integrated circuit device assembly of claim 27, wherein said dielectric material is a polymeric film joined to the upper and lower leadframe members with an adhesive.

39. An integrated circuit device assembly comprising:
   a housing;
   an integrated circuit (IC) chip in said housing, said IC chip having a first surface with a plurality of contact pads arranged thereon and a second surface for mounting said chip, said chip subject to transient electrical coupling and noise generation;
   an upper conductive planar leadframe member having an upper surface to which said second surface is mounted over a major area portion thereof with an intervening electrically insulative adhesive, and a lower surface;
   a lower conductive planar leadframe member having an upper surface to which the lower surface of said upper leadframe member is mounted over a portion thereof with a thin intervening layer of dielectric material whereby capacitance results, said lower leadframe member subdivided into multiple portions, at least one of said multiple portions having an exposed tab connected to said circuit and having tailored operating capacitance/frequency characteristics in cooperation with the upper leadframe member;
   at least one lead connecting said at least one contact pad to at least one lead finger; and
   at least one other lead connected to a at least one tab of said lower leadframe member and across portions of said integrated circuit subject to transient coupling and noise generation.

40. The integrated circuit device assembly of claim 39, wherein the upper leadframe member is unitary and is connected to one of a power supply Vss and Vdd to provide a common voltage to said upper leadframe member.

41. The integrated circuit device assembly of claim 39, wherein said lower leadframe member is subdivided into a plurality of coplanar portions representing individual capacitors having said upper leadframe member as a common side.

42. The integrated circuit device assembly of claim 39, wherein said subdivided multiple portions of said lower leadframe member include one portion configured for high end frequency noise suppression and another portion configured for low end frequency noise suppression.

43. The integrated circuit device assembly of claim 39, wherein said subdivided multiple portions of said lower leadframe member includes:
   a portion configured for decoupling of high transient voltage, said portion together with the non-subdivided leadframe member electrically connected across the Vdd and Vss of said integrated circuit.

44. The integrated circuit device assembly of claim 39, wherein the upper and lower leadframe members together comprise a portion of a multi-level leadframe.

45. The integrated circuit device assembly claim 39, wherein said contact pad includes:
   a pad arrayed along a portion of a periphery of at least one side of said first surface of said chip.

46. The integrated circuit device assembly of claim 39, further comprising a third, uppermost leadframe member including inner lead fingers and external leads.

47. The integrated circuit device assembly of claim 39, wherein said chip comprises a LOC chip with at least one contact pad arrayed along a substantially central axis thereof.

48. The integrated circuit device assembly of claim 39, wherein said at least one other lead connected to said lower leadframe member comprises a conductive wire.

49. The integrated circuit device assembly of claim 39, wherein said dielectric material is a polymeric adhesive.

50. The integrated circuit device assembly of claim 39, wherein said dielectric material is a polymeric film joined to the upper and lower leadframe members with an adhesive.

51. An integrated circuit device assembly comprising:
   a housing;
   an integrated circuit (IC) chip in said housing, said IC chip having an integrated circuit therein, said IC chip having a first surface with a plurality of contact pads arranged thereon and a second surface for mounting said chip, said chip subject to transient electrical coupling and noise generation;
   an upper conductive leadframe member having an upper surface to which said second surface is mounted over a portion of the area portion thereof with an intervening electrically insulative adhesive, and a lower surface;
   a lower conductive leadframe member having an upper surface to which the lower surface of said upper leadframe member is mounted over a portion thereof with a thin intervening layer of dielectric material whereby capacitance results;
   leads connecting some of said contact pads to lead fingers;
   leads connected to said upper and lower leadframe members and across portions of said integrated circuit of said IC chip subject to transient coupling and noise generation;
   wherein one of said upper and lower leadframe members is subdivided into multiple portions, each of said multiple portions having at least one exposed tab connected to said circuit and having tailored operating capacitance/frequency characteristics in cooperation with the other leadframe member.

52. The integrated circuit device assembly of claim 51, wherein at least one leadframe member is unitary and is connected to one of a power supply Vss and Vdd to provide a common voltage to the at least one leadframe member.

53. The integrated circuit device assembly of claim 51, wherein said upper leadframe member is subdivided into a plurality of portions forming individual capacitors having said lower leadframe member as a common side.

54. The integrated circuit device assembly of claim 51, wherein said lower leadframe member is subdivided into a plurality of portions forming individual capacitors having said upper leadframe member as a common side.

55. The integrated circuit device assembly of claim 51, wherein each of said upper leadframe member and said lower leadframe member is subdivided into a plurality of portions, wherein said lower leadframe portions are configured to match and be joined to corresponding upper leadframe portions.

56. The integrated circuit device assembly of claim 51, wherein said subdivided multiple portions of said one of said upper and lower leadframe members include one portion configured for high end frequency noise suppression and another portion configured for low end frequency noise suppression.

57. The integrated circuit device assembly of claim 51, wherein said subdivided multiple portions of said one of said upper and lower leadframe members include a portion configured for decoupling of high transient voltage, said portion together with the non-subdivided leadframe member electrically connected across the Vdd and Vss of said integrated circuit.

58. The integrated circuit device assembly of claim 51, wherein the upper and lower leadframe members together comprise a portion of a multi-level leadframe.

59. The integrated circuit device assembly of claim 51, wherein said contact pads include contact pads arrayed along a periphery of at least one side of said first surface of said chip.

60. The integrated circuit device assembly of claim 51, further comprising a third, uppermost leadframe member including inner lead fingers and external leads.

61. The integrated circuit device assembly of claim 51, wherein said chip comprises a LOC chip with contact pads arrayed along a substantially central axis.

62. The integrated circuit device assembly of claim 51, wherein said leads connected to said upper and lower leadframe members comprise conductive wires.

63. The integrated circuit device assembly of claim 51, wherein said dielectric material is a polymeric adhesive.

64. The integrated circuit device assembly of claim 51, wherein said dielectric material is a polymeric film joined to the upper and lower leadframe members with an adhesive.

65. A method for making an integrated circuit package having a chip with an active surface and an opposite support surface, said method comprising:
   forming a multi-level conductive leadframe with a lower leadframe portion and an upper leadframe portion partially coextensive therewith, said upper and lower leadframe portions having upper and lower surfaces, said upper surface of said upper leadframe portion configured to be bonded to the support surface of a semiconductor chip, said upper leadframe portion subdivided into a plurality of units having at least one outwardly extending conductive tab, one of said lower and upper leadframe portions having centrally directed inner leads;
   joining the upper surface of the lower leadframe portion to the lower surface of one of the plurality of units of said subdivided upper leadframe portion by an intervening thin layer of dielectric material, whereby each of the plurality of units formed by the upper leadframe portion and said intervening dielectric material comprises a capacitor;
   bonding the support surface of said semiconductor chip to the upper surface of the subdivided upper leadframe portion with an insulative adhesive;
   lancing the leadframe portions to singulate inner leads therefrom;
   bonding conductive wires between wire bond pads on the active surface of the chip and the inner leads, the at least one conductive tab of the subdivided upper leadframe portion, and the lower leadframe portion;
   encapsulating the semiconductor chip, inner leads, a plurality of capacitors, and conductive wires in a plastic package; and
   lancing external lead portions to form outer leads for connecting the integrated circuit package to an electronic apparatus.

* * * * *

UNITED STATES PATENT AND TRADEMARK OFFICE
CERTIFICATE OF CORRECTION

PATENT NO.   : 6,054,754
DATED        : April 25, 2000
INVENTOR(S)  : Bissey

It is certified that error appears in the above-identified patent and that said Letters Patent is hereby corrected as shown below:

Title page,
Item [56], References Cited, U.S. PATENT DOCUMENTS,
Change "5,311,657" to -- 5,311,057 -- ;
Change "5,485,032" to -- 5,485,037 --;
Change "Muroi" to -- Moroi --;
Change "Steve" to -- Stave -- ;
FOREIGN PATENT DOCUMENTS, delete 4th entry, and
OTHER PUBLICATIONS, change "(TM)" to -- (TM -- .

Drawings,
Figs. 2 and 3, insert reference numeral -- 10 -- and reference arrow therefor.

Column 1,
Line 28, change "requires" to -- require --;
Line 44, change "leadframe" to -- lead frame --;
Line 45, change "crosstalk" to -- cross-talk --;
Line 59, after "and" insert -- a --;
Line 60, delete ",";

Column 2,
Line 3, after "board" insert -- , --;
Line 26, change "operate" to -- operates --;
Line 27, after "which" and "course" insert -- , --;
Line 36, change "leadframe" to -- lead frame --;
Line 60, after "al." insert -- , --;

Column 3,
Lines 9-10, change "lead-frame" to -- lead frame -- ;
Line 59, change "capacitance" to -- capacitances --;
Line 66, delete "e.g.";

UNITED STATES PATENT AND TRADEMARK OFFICE
CERTIFICATE OF CORRECTION

PATENT NO. : 6,054,754
DATED : April 25, 2000
INVENTOR(S) : Bissey

It is certified that error appears in the above-identified patent and that said Letters Patent is hereby corrected as shown below:

Column 4,
Line 8, delete ",";
Line 21, after "Thus" insert -- , --;
Line 31, change "wirebond" to -- wire bond --;
Line 32, change "the" to -- its --;
Line 58, delete "e.g.";
Line 58, after "including" and "to" insert -- , --;
Line 60, after "the" insert -- packaged --;
Line 63, after "e.g." insert -- , --;
Line 64, after "The" insert -- packaged --;
Line 65, after "The" insert -- semiconductor --;

Column 5,
Line 1, after "16" delete ",";
Line 11, change "24B" to -- 24A --;
Line 14, change "24A" to -- 24B --;
Line 15, after "material" insert -- layer --;
Line 15, before "comprise" insert -- 32 --;
Line 16, change "die" to -- chip --;
Line 16, after "The" insert -- semiconductor --;
Line 20, after "dielectric" insert -- material --;
Line 23, after "The dielectric" insert -- material layer 32 --;
Line 26, after "dielectric" insert -- material layer 32 --;
Line 27, after "material" insert -- , --;
Line 34, after "material" insert -- layer --;
Line 39, change "dielectrics" to -- dielectric material layers --;
Line 43, after "interposed" insert -- dielectric material --;
Line 50, after "material" insert -- layer --;
Line 57, change "package" to -- packaged --;
Line 57, before "10." insert -- integrated circuit device --;
Line 61, after "Thus" insert -- , --;
Line 66, change "integrated circuit 10." to -- packaged integrated circuit device 10. --;

UNITED STATES PATENT AND TRADEMARK OFFICE
CERTIFICATE OF CORRECTION

PATENT NO.   : 6,054,754
DATED          : April 25, 2000
INVENTOR(S) : Bissey

It is certified that error appears in the above-identified patent and that said Letters Patent is hereby corrected as shown below:

Column 6,
Line 7, after "leads" insert -- , -- ;
Lines 22 and 52, after "to the" insert -- semiconductor --;
Line 25, change "chip surface 16" to -- semiconductor chip active surface 16 --;
Line 28, delete "e.g.";
Lines 34 and 36, delete "44";
Line 35, delete "(see FIG. 2)";
Line 37, after "of the" insert -- multi-level --;
Lines 41, 51 and 55, after "of the" insert -- semiconductor --;
Line 45, delete "48";
Line 51, change "surface 42" to -- surface 16 --;
Line 53, delete "by";
Line 54, delete "example";
Line 58, after "dielectric" insert -- material --;
Line 66, after "other" insert -- wire --;

Column 7,
Line 2, after "and the" insert -- insulative -- and after "bonds the" insert -- semiconductor --;
Lines 5 and 18, before "chip" insert -- semiconductor --;
Lines 7 and 8, change "50" to -- 22 --;
Line 9, after "the" insert -- semiconductor --;
Line 15, change "upper surface" to -- peripheral area --;
Line 17, delete ",";
Line 18, before "chip" insert -- semiconductor --;
Line 22, after "the" insert -- multi-level --;
Line 29, after "The" insert -- third uppermost --;
Line 31, after "upper" insert -- active -- and after "LOC" insert -- semiconductor --;
Line 34, after "dielectric" insert -- material --;
Line 35, change "frame" to -- frames --;
Line 37, after "of the" insert -- third --;
Line 41, before "pads" insert -- wire bond --;
Lines 42 and 43, after "connect" insert -- wire bond --;
Lines 44 and 50, before "buses" insert -- transverse- --;
Lines 50 and 54, after "third" insert -- uppermost --;
Line 52, delete "portion";
Line 54, after "frame" insert -- 62 --;

UNITED STATES PATENT AND TRADEMARK OFFICE
CERTIFICATE OF CORRECTION

PATENT NO. : 6,054,754
DATED : April 25, 2000
INVENTOR(S) : Bissey

It is certified that error appears in the above-identified patent and that said Letters Patent is hereby corrected as shown below:

Column 8,
Line 7, change "semiconductor" to -- packaged integrated circuit --;
Line 15, change "said" to -- the --;
Lines 29, 32, and 38, before "chip" insert -- semiconductor --;
Line 34, after "by" and after "e.g." insert -- , --;
Line 37, delete "e.g.";
Line 41, delete "," after "fingers";
Line 52, after "herein" insert -- , --; and
Line 53, delete "," after "only".
Line 62, change "An" to -- A packaged --;
Line 64, change "an" to -- a first --;
Line 67, after "said" insert -- IC --;

Column 9,
Lines 1, 45 and 52, change "leadframe" to -- lead frame --;
Line 5, change "upper leadframe" to -- upper conductive planar lead frame --;
Line 9, change "leadframe" to -- lead frame --;
Lines 11, 13, 24, 26, 28, 30, 34, 39, 41, 44, 60 and 66, change "leadframe" to -- conductive planar lead frame --;
Line 15, change "leadframe" to -- planar lead frame --;
Line 16, after "connecting" insert -- said --;
Line 18, after "one" insert -- other -- and change "a" to -- said --;
Line 19, change "leadframe" to -- conductive planar lead frame --;
Lines 20, 23, 27, 32, 37, 43, 46, 50, 54, 58, 62 and 64, after "The" insert -- packaged --;
Line 39, change "includes" to -- include --;
Line 41, change "non-subdivided" to -- lower --;
Line 42, change "the" to -- one of a power supply -- and after "said" insert -- at least one --;
Line 47, after "said" insert -- at least one --;
Line 48, after "first" insert -- active --;
Line 49, after "said" insert -- IC --;
Line 52, change "a third," to -- an --;
Line 55 and 57, after "said" insert -- IC --;
Line 63 and 65, after "material" insert -- layer --;

UNITED STATES PATENT AND TRADEMARK OFFICE
CERTIFICATE OF CORRECTION

PATENT NO. : 6,054,754
DATED : April 25, 2000
INVENTOR(S) : Bissey

It is certified that error appears in the above-identified patent and that said Letters Patent is hereby corrected as shown below:

Column 10,
Line 1, change "An" to -- A packaged --;
Line 3, change "an" to -- a first --;
Lines 6, 55, 61 and 63, after "said" insert -- IC --;
Lines 7, 11, 51 and 58, change "leadframe" to -- lead frame --;
Lines 13, 15, 19, 20, 25, 30, 32, 34, 36, 40, 45, 47, 50, and 66 change "leadframe" to -- conductive planar lead frame --;
Line 22, after "connecting" insert -- said --;
Line 24, after "one" insert -- other -- and change "a" to -- said --;
Lines 26, 29, 33, 38, 43, 49, 52, 56, 60 and 64, after "The" insert -- packaged --;
Line 45, change "includes" to -- include --;
Line 47, change "non-subdivided" to -- upper --;
Line 48, change "the" to -- one of a power supply -- and after "said" insert -- at least one --;
Line 53, after "said" insert -- at least one --;
Line 54, after "first" insert -- active --;
Line 58, change "a third," to -- an --;

Column 11,
Lines 1, 3, 35, 39, 44, 49, 55, 58, 62 and 66, after "The" insert -- packaged --;
Lines 2 and 4, after "material" insert -- layer --;
Lines 5, 18, 24, 26, 32, 36, 38, 40, 42, 46, 51, 53 and 56, change "leadframe" to -- conductive planar lead frame --;
Line 6, change "An" to -- A packaged --;
Line 12, after "said" (both occurrences) insert -- IC --;
Lines 14, 22, 57 and 64, change "leadframe" to -- lead frame --;
Line 28, change "leadframe" to -- planar lead frame --;
Line 29, after "connecting" insert -- said --;
Line 31, after "one" insert -- other -- and change "a" to -- said --;
Line 33, after "transient" insert -- electrical --; and after "said" insert -- at least one --;
Line 35, change "claim 25," to -- claim 27, --;
Line 51, change "includes" to -- include --;
Line 53, change "non-subdivided" to -- lower --;
Line 54, after "said" insert -- at least one --;
Line 54, change "the" to -- one of a power supply --;
Line 60, change "a pad" to -- a contact pad --;
Lines 61 and 67, after "said" insert -- IC --;
Line 64, change "a third," to -- an --;

UNITED STATES PATENT AND TRADEMARK OFFICE
CERTIFICATE OF CORRECTION

PATENT NO. : 6,054,754
DATED : April 25, 2000
INVENTOR(S) : Bissey

It is certified that error appears in the above-identified patent and that said Letters Patent is hereby corrected as shown below:

Column 12,
Lines 3, 7, 9, 39, 43, 48, 53, 60 and 63 after "The" insert -- packaged --;
Lines 5, 11, 25, 27, 32, 36, 40, 42, 44, 46, 50, 55, 58 and 61, change "leadframe" to -- conductive planar lead frame --;
Lines 8 and 10, after "material" insert -- layer --;
Line 12, change "An" to -- A packaged --;
Line 14, after "housing," insert -- said IC chip having an integrated circuit therein, --;
Line 17, after "said" (both occurrences) insert -- IC -- ;
Lines 19, 23 and 62, change "leadframe" to -- lead frame --;
Line 30, after "said" insert -- integrated --;
Line 33, delete "said" and after "pad" insert -- of said plurality of contact pads --;
Line 35, after "to" delete "a";
Line 37, after "transient" insert -- electrical --;
Line 55, change "includes:" to -- include: --;
Line 57, change "non-subdivided" to -- upper --;
Line 58, change "the" to -- one of a power supply --;
Line 63, after "assembly" insert -- of --;
Line 64, change "pad includes:" to -- pads include: --;
Line 64, after "said" insert -- plurality of --;
Line 65, change "a pad" to -- pads --;
Line 66, before "chip" insert -- IC --;

Column 13,
Lines 1, 4, 8, 11, 13, 16, 44, 48, 52, 56 and 62, after "The" insert -- packaged--;
Lines 2, 24, 28, 45 and 47, change "leadframe" to -- lead frame --;
Line 2, change "a third," to -- an--;
Line 5, after "said" insert -- IC --;
Line 9, after "to said" insert -- at least one tab of said --;
Lines 12 and 14, after "material" insert -- layer --;
Line 15, change "leadframe" to -- conductive planar lead frame --;
Line 22, after "said" (both occurrences) insert -- IC --;
Line 26, delete "portion of the" at the beginning of the line and insert -- major -- therefor;
Lines 30, 34 and 38, change "leadframe" to -- conductive lead frame --;
Line 33, after "said" insert -- plurality of --;
Line 36, after "transient" insert -- electrical --;
Line 41, after "said" insert -- integrated --;
Line 43, change "leadframe member." to -- of said upper and lower conductive lead frame members. --;
Lines 59, change "leadframe" to -- conductive lead frame member --;

UNITED STATES PATENT AND TRADEMARK OFFICE
CERTIFICATE OF CORRECTION

PATENT NO.    : 6,054,754
DATED         : April 25, 2000
INVENTOR(S)   : Bissey

It is certified that error appears in the above-identified patent and that said Letters Patent is hereby corrected as shown below:

Column 13 (cont.),
Lines 49, 51, 53, 55, 57 and 58, change "leadframe" to -- conductive lead frame --;
Lines 60-61, change "lead-frame" to -- conductive lead frame member --;
Line 64, change "leadframe" to --conductive lead frame --;

Column 14,
Lines 1, 8, 11, 15, 18, 21, 24 and 26, after "The" insert -- packaged --;
Lines 3, 5, 9, 23 and 28, change "leadframe" to -- conductive lead frame --;
Line 5, delete "non-subdivided" and insert -- other of said upper and lower -- therefor and change "member" to -- members --;
Line 6, change "the" to -- one of a power supply --;
Lines 10, 16, 32, 35, 36, 38, 41, 43, 45, 47, 51 and 53, change "leadframe" to -- lead frame --;
Line 12, after "said" insert -- plurality of --;
Lines 14 and 19, after "said" insert -- IC --;
Line 16, change "a third," to -- an--;
Lines 25, 27 and 48, after "material" insert -- layer --;
Line 30, before "chip" insert -- semiconductor --;
Lines 33 and 57-58, change "leadframe" to -- lead frame -- (both occurrences);
Line 35, after "portions" insert -- each --;
Line 37, change "a" to -- said --;
Lines 48-49, change "comprises" to -- comprising --;
Line 56, before "chip" insert -- semiconductor --;
Line 59, before "inner" insert -- the --; and
Line 60, after "and" insert -- the --.

Signed and Sealed this

Twenty-first Day of May, 2002

*Attest:*

*Attesting Officer*

JAMES E. ROGAN
*Director of the United States Patent and Trademark Office*